United States Patent
Kurth et al.

(10) Patent No.: US 9,460,890 B2
(45) Date of Patent: Oct. 4, 2016

(54) PHASE PLATE FOR A TRANSMISSION ELECTRON MICROSCOPE

(71) Applicant: FEI Company, Hillsboro, OR (US)

(72) Inventors: Patrick Kurth, Bornheim (DE); Steffen Pattai, Sinzig (DE); Joerg Wamser, Bonn (DE)

(73) Assignee: FEI COMPANY, Hillsboro, OR (US)

( * ) Notice: Subject to any disclaimer, the term of this patent is extended or adjusted under 35 U.S.C. 154(b) by 135 days.

(21) Appl. No.: 14/548,077

(22) Filed: Nov. 19, 2014

(65) Prior Publication Data

US 2015/0136172 A1    May 21, 2015

(30) Foreign Application Priority Data

Nov. 19, 2013   (DE) .................. 10 2013 019 297

(51) Int. Cl.
    C25F 1/00    (2006.01)
    H01J 37/26   (2006.01)
    B08B 7/00    (2006.01)

(52) U.S. Cl.
    CPC .............. *H01J 37/263* (2013.01); *H01J 37/26* (2013.01); *B08B 7/00* (2013.01); *H01J 2237/022* (2013.01); *H01J 2237/2614* (2013.01)

(58) Field of Classification Search
    None
    See application file for complete search history.

(56) References Cited

U.S. PATENT DOCUMENTS

| 3,908,124 A | 9/1975 | Rose |
| 4,665,315 A | 5/1987 | Bacchetti et al. |
| 5,510,624 A | 4/1996 | Zaluzec |
| 5,633,502 A * | 5/1997 | Fischione ............. G01N 1/32 250/440.11 |
| 5,814,815 A | 9/1998 | Matsumoto et al. |
| 6,452,315 B1 | 9/2002 | Vane |
| 6,548,810 B2 | 4/2003 | Zaluzec |
| 6,674,078 B2 | 1/2004 | Nagayama et al. |
| 6,744,048 B2 | 6/2004 | Hosokawa et al. |
| 6,797,956 B2 | 9/2004 | Benner |
| 7,737,412 B2 | 6/2010 | Jin et al. |
| 7,741,602 B2 | 6/2010 | Benner et al. |
| 7,851,757 B2 | 12/2010 | Nagayama |
| 7,902,506 B2 | 3/2011 | Schroder et al. |
| 7,915,584 B2 | 3/2011 | Tiemeijer et al. |
| 7,928,379 B2 | 4/2011 | Zach |
| 7,977,633 B2 | 7/2011 | Barton et al. |
| 8,071,954 B2 | 12/2011 | Wagner et al. |

(Continued)

FOREIGN PATENT DOCUMENTS

| EP | 1476890 A2 | 11/2004 |
| EP | 1845551 A1 | 10/2007 |

(Continued)

OTHER PUBLICATIONS

Janbroers S., et al.,"Preparation of carbon-free TEM microgrids by metal sputtering", Ultramicroscopy, 2009, pp. 1105-1109, vol. 109.

(Continued)

*Primary Examiner* — Binh X Tran
*Assistant Examiner* — David Cathey, Jr.
(74) *Attorney, Agent, or Firm* — Scheinberg & Associates, P.C.; Michael O. Scheinberg

(57) ABSTRACT

The present invention relates to a method for cleaning a phase plate (1) for a transmission electron microscope wherein said phase plate is etched before being irradiated for the first time in the TEM, and is then held in an ultra-pure holding atmosphere until the irradiation in the TEM.

13 Claims, 2 Drawing Sheets

(56) References Cited

U.S. PATENT DOCUMENTS

| | | | |
|---|---|---|---|
| 8,487,268 B2 | 7/2013 | Gerthsen et al. | |
| 8,637,821 B2 | 1/2014 | Buijsse et al. | |
| 8,772,716 B2 | 7/2014 | Buijsse | |
| 8,787,585 B2 | 7/2014 | Brown | |
| 2002/0011566 A1 | 1/2002 | Nagayama et al. | |
| 2004/0195525 A1 | 10/2004 | Spill | |
| 2008/0035854 A1* | 2/2008 | Jin | H01J 37/26 250/396 R |
| 2008/0202918 A1 | 8/2008 | Nagayama et al. | |
| 2009/0166558 A1 | 7/2009 | Nagayama | |
| 2010/0065741 A1 | 3/2010 | Gerthsen et al. | |
| 2010/0155620 A1* | 6/2010 | Hutchison | H01J 37/20 250/440.11 |
| 2011/0315876 A1 | 12/2011 | Buijsse et al. | |
| 2012/0037815 A1* | 2/2012 | Shiue | H01J 37/147 250/441.11 |
| 2012/0199756 A1 | 8/2012 | Buijsse et al. | |
| 2013/0032732 A1* | 2/2013 | Safar | H01J 37/185 250/442.11 |
| 2014/0061463 A1 | 3/2014 | Buijsse et al. | |
| 2014/0326876 A1* | 11/2014 | Buijsse | H01J 37/263 250/307 |

FOREIGN PATENT DOCUMENTS

| | | |
|---|---|---|
| JP | S607048 A | 1/1985 |
| JP | 2000268765 A | 9/2000 |
| JP | 2001084938 A | 3/2001 |
| JP | 2001273866 | 5/2001 |
| JP | 2005116365 A | 4/2005 |
| WO | 2009122145 A2 | 10/2009 |
| WO | 2011071819 A1 | 6/2011 |

OTHER PUBLICATIONS

Majorovits, Endre, "Dissertation submitted to the Combined Faculties for the Natural Sciences and for Mathematics of the Ruperto-Carola University of Heidelberg, Germany for the degree of Doctor of Natural Sciences," 2002, Germany.

Marko,Michael et al., "Retrofit implementation of Zernike phase plate imaging for cryo-TEM," Journal of Structural Biology, vol. 174, pp. 400-412, 2011, Japan.

Nagayama, Kiniaki et al., "Phase Contrast Enhancement with Phase Plates in Biological Electron Microscopy," Cambridge Press, vol. 18, No. 4, 2010, US.

Danev, Radostin, et al., "Optimizing the phase shift and the cut-on periodicity of phase plates for TEM," Ultramicroscopy, Apr. 30, 2011, pp. 1305-1315, vol. 111.

Ishizuka, Kazuo, et al., "Phase Measurement in Electron Microscopy Using the Transport of Intensity Equation," Microscopy Today, May 2005, pp. 22-24.

Nagayama, Kuniaki, et al., "Phase contrast electron microscopy: development of thin-film phase plates and biological applications," Phil. Trans. R. Soc. B, 2008, pp. 2153-2162, vol. 363.

Unwin, P.N.T., et al., "Phase contrast and interference microscopy with the electron microscope", Phil. Trans. Roy. Soc. Lond. B., 1971, pp. 95-104, vol. 261.

Zemlin, F., "Image Formation in High-Resolution Electron Microscopy," Cryst. Res. Technol., 1998, pp. 1097-1111, vol. 33, No. 7-8.

Danev, Radostin, et al., "Transmission electron microscopy with Zernike phase plate," Ultramicroscopy, 2001, pp. 243-252, vol. 88.

Danev, R., et al., "A Novel Phase-contrast Transmission Electon Microscopy Producting High-contrast Topographic Images of Weak Objects," Journal of Biological Physics, 2002, pp. 627-635, vol. 28.

Danev, Radostin, "Zernike phase contrast cryo-electron tomography," Journal of Structural Biology, 2010, pp. 174-181, vol. 171.

Danev, Radostin, et al., "Methods in Enzymology—Phase Plates for Transmission Electron Microscopy", Elsevier, Oct. 2010, pp. 343-369, Chapter 14.

Glaeser, Robert M., et al., "Minimizing elctrostatic charging of an aperture used to produce in-focus phase contrast in the TEM," Ultramicroscopy, 2013, pp. 6-15, vol. 135.

Glaeser, Robert M., "Invited Review Article: Methods for imaging weak-phase objects in electron microscopy", Review of Scientific Instruments, 2013, pp. 111101-1, 111101-17., vol. 84.

Hettler, Simon, et al., "Improving Fabriction and Application of Zach Phase Plates for Phase-Contrast Transmission Electron Microscopy", Microsc. Microanal., 2012, pp. 1010-1015, vol. 18.

Kuo, Pai-Chai, "On-Chip Thin Film Zernike Phase Plate for In-Focus Transmission Electron Microscopy Imaging of Organic Materials", American Chemical Society, 2013, pp. 465-470, vol. 7, No. 1.

Majorovits, E., "Optimizing phase contrast in transmission electron microscopy with an electrostatic (Boersch) phase plate", Ultramicroscopy, 2007, pp. 213-226, vol. 107.

Malac, Marek, "Convenient Contrast enhancement by a hole-free phase plate", Ultramicroscopy, 2012, pp. 77-89, vol. 118.

Marko, Michael, "Methods for testing Zernike phase plates and a report on silicon-based phase plates with reduced charging and improved ageing characteristics", Journal of Structural Biology, 2013, pp. 237-244, vol. 184.

Malac, Marek, et al., "Convenient contrast enhancement by a hole-free phase plate," Ultramicroscopy, vol. 18, pp. 77-89, 2012.

Nagayama, Kuniaki, "Another 60 years in electron microscopy: development of phase-plate electron microscopy and biological applications" Journal of Electron Microscopy, 2011, pp. S43-S62, vol. 60, No. 1.

Schultheiss, K., "Fabrication of a Boersch phase plate for phase contrast imaging in a transmission electron microscope" Review of Scientific Instruments, 2006, pp. 033701-1, 033701-4, vol. 77.

Schultheiss, Katrin, et al., "New Electrostatic Phase Plate for Phase-Contrast Transmission Electron Microscopy and Its Application for Wave-Function Reconstruction", Micrrosc. Microanal., 2010, pp. 785-794, vol. 16.

Johnson, H.M., "In-Focus Phase Contrast Electron Microscopy," Principles and Techniques of Electron Microscopy, vol. 3, pp. 153-203, 1973.

Idzorek, G. C. et al., Reproducible, rugged, and inexpensive photocathode x-ray diode, Review of Scientific instruments vol. 79, 2008, pp. 10E922-1-10E922-3.

Marko,Michael et al., "Retrofit implementation of Zernike phase plate imaging for cryo-TEM," Journal of Structural Biology, 2011, vol. 174, pp. 400-412, , Japan.

Muller, H. et al., "Design of an electron microscope phase plate using a focused continuous-wave laser," New Journal of Physics vol. 12, 2010, pp. 2-10.

* cited by examiner

PHASE PLATE FOR A TRANSMISSION ELECTRON MICROSCOPE

This application claims priority from German Pat. App. 102013019297.8 filed Nov. 19, 2013

The present invention relates to a phase plate, specifically to its use for a transmission electron microscope (TEM).

This type of phase plate can be used, for example, when observing an organic, for example deep frozen specimen. In this type of application the image contrast may be comparatively small and a substantial part of the image information may be contained in a phase shift of the scattered electron beam. In attempts to make this phase shift visible in the image by means of defocusing, impairment of the resolution, for example, proved to be disadvantageous.

Therefore, the most recent developments involve providing in the beam path of the TEM, downstream of the specimen, a phase plate, which subjects part of the electron beam to an additional phase shift. Therefore, for example, non-scattered electrons may pass through the phase plate without any further interaction, for example through a through hole in the phase plate, whereas the scattered electrons pass through the phase plate material and are accordingly subjected to an additional phase shift. The contrast in the image can thus be increased.

The technical problem underlying the present invention is to specify a particularly advantageous method for cleaning a phase plate.

According to the invention this object is achieved by a method wherein the phase plate is etched with an etching agent suitable for removing compounds containing oxygen and/or carbon, this etching taking place before the phase plate is irradiated for the first time in the TEM, and furthermore, after the etching, for the irradiation in the TEM, the phase plate being held in a holding atmosphere in which the portion of compounds containing oxygen and/or carbon is reduced.

In this respect, in the case of the compounds containing oxygen, "reduced" means a concentration of at most $1 \times 10^{11}/cm^3$, preferably at most $5 \times 10^{10}/cm^3$, more preferably at most $1 \times 10^{10}/cm^3$, and in the case of compounds containing carbon, a concentration of at most $5 \times 10^{13}/cm^3$, preferably at most $1 \times 10^{13}/cm^3$, more preferably at most $5 \times 10^{12}/cm^3$. Technically, in the case of the compounds containing oxygen, possible lower limits can be for example $1 \times 10^8/cm^3$ or $1 \times 10^9/cm^3$, and in the case of the compounds containing carbon for example $5 \times 10^{10}/cm^3$ or $5 \times 10^{11}/cm^3$.

The "compound containing oxygen" can for example also be the oxygen contained in the ambient air, and so the specified concentrations can relate, for example, to $O_2$ molecules. The term "compound" is therefore to be understood as meaning chemical compounds, in particular molecules, and not the number of particles (a plurality of molecules can for example form a dust particle). Volatile organic hydrocarbons or dimethyl sulphate are examples of compounds containing carbon.

These specified concentrations relate in this connection to molecules moving freely in the holding atmosphere or to molecules in freely moving compounds, i.e. not to elements limiting the volume containing the free-holding atmosphere therefore, for example, a sealing ring sealing the examination chamber or an organic sample infiltrated into the examination chamber should (needless to say) not be taken into account when identifying the molecules containing carbon.

In the "etching" of the phase plate, in principle it is not the phase plate material itself, but for example oxide compounds or carbon deposits on the surface, that should be removed. In this connection the inventors have found that surprisingly, satisfactory results can only be achieved by etching before the first irradiation. Therefore, if etching only takes place after the first irradiation (with electrons during an examination), according to the present situation more impurities are deposited and these are clearly harder to remove.

Additional preferred embodiments are to be found in the dependent claims and the following description, no distinction being made between the presentation of the use and method aspects or the corresponding apparatus; the disclosure is to be understood, at least implicitly, with regard to all categories of claim.

In one preferred configuration the holding atmosphere is a high vacuum, and so the pressure is at most $10^{-3}$ mbar, preferably at most $10^{-4}$ mbar, and more preferably at most $10^{-5}$ bar.

In general, the "holding atmosphere" is the atmosphere present after the etching, i.e. immediately after the end of the etching process, in particular after removing the etching substances (i.e. the etching agent), and which is ideally present until the start of irradiation with electrons when examining a sample in the TEM. In this respect the holding atmosphere should therefore be present without interruption from after etching until irradiation (and generally also during the latter).

Even though the holding atmosphere is, therefore, preferably a vacuum, in general a protective gas correspondingly largely free from compounds containing oxygen and/or carbon, for example, that would therefore have to be ultra-pure, could also be provided for the holding of the phase plate, the "holding atmosphere" condition not being interrupted until the irradiation in the TEM.

In a preferred configuration the phase plate is dry etched, generally for example also with argon as the process gas, i.e. mechanical particle removal. Preferably, etching is at least also chemical, i.e. an argon/hydrogen mixture, for example, can be provided.

In general, the dry etching can also take place in at least two stages each with a different process gas or a different process gas mixture ratio, i.e. for example in a first step oxygen can be provided as the process gas, and in a second step hydrogen can be provided as the process gas; an additional process gas, for example argon, can in principle respectively also be present here.

However, it is particularly preferable for oxygen to be the only process gas in a one-step process.

Independently of the process gas in detail, in a preferred configuration, the dry etching takes place in the TEM, and generally this does not necessarily mean in the examination chamber itself, but at least in a part structurally connected to the latter, for example also detachable by means of a screw connection. For example, a sluice connected to the examination chamber by a sluice gate can therefore be provided, and the phase plate can be dry etched in this sluice. The phase plate (not yet irradiated) can therefore be introduced, for example, into the sluice, and the sluice can then be evacuated; before the phase plate is moved out of the sluice into the examination chamber it is dry etched, preferably at an intermediate pressure described in detail below. The sluice can then be further evacuated up to approximately the pressure in the examination chamber; after opening the (inner) sluicegate the phase plate can be moved into the examination chamber.

The dry etching apparatus, in particular its electrode(s) or coil(s), is not necessarily disposed in the sluice itself here, but can also be provided as a dry etching chamber connected pressure-fluidically to the latter, for example connected by a valve which is then open during the dry etching. The supply of gas, and so the intermediate pressure, can be set by opening a valve, in particular a needle valve, which is preferably disposed at the dry etching chamber itself.

Alternatively to the sluice, dry etching within the examination chamber of the TEM itself may also be preferred. The phase plate is mounted here in the TEM, i.e. the examination chamber is flooded, generally with ambient air, and opened, and is then disposed in the beam path. Next—before the first irradiation with electrons—the phase plate is dry etched in the examination chamber. In this connection the holding atmosphere is generally a high vacuum in the examination chamber.

In a preferred configuration the examination chamber of the TEM is opened, the phase plate is inserted when the examination chamber is flooded, and the examination chamber is then evacuated again, preferably up to intermediate pressure. At this intermediate pressure the phase plate is then dry etched in the examination chamber. Finally, the examination chamber is evacuated further up to a final pressure which, measured in mbar, is smaller than the intermediate pressure by at least one order of magnitude. Thus, the etching of the phase plate can advantageously be integrated into the process of inserting the phase plate.

Even though in this embodiment the phase plate is etched in the examination chamber, the dry etching apparatus itself does not necessarily have to be disposed in the examination chamber. A dry etching chamber connected pressure-fluidically to the examination chamber, in particular by means of a valve, is preferred.

In general, the intermediate pressure can be for example at most $5 \times 10^{-3}$ mbar, preferably at most $2.5 \times 10^{-3}$ mbar, more preferably at most $1 \times 10^{-3}$ mbar, and (independently of these upper limits) for example at least $5 \times 10^{-5}$ mbar, preferably at least $7.5 \times 10^{-5}$, more preferably at least $10^{-4}$ mbar. The final pressure can be for example at most $5 \times 10^{-6}$ mbar, preferably at most $10^{-6}$ mbar; lower limits for the vacuum are given by what is possible technically in a vacuum. After inserting the phase plate, evacuation up to intermediate pressure takes place, particularly preferably directly, i.e. without previously reaching a lower pressure.

In a preferred configuration, in order to provide the process gas, a gas containing oxygen, preferably ambient air, is supplied, metered, to the examination chamber in order to set the intermediate pressure of at most $5 \times 10^{-3}$ mbar and at least $5 \times 10^{-5}$ mbar (the values disclosed above as preferred for the intermediate pressure should also be disclosed in this connection). Generally, the gas is not supplied directly to the examination chamber here, but to a dry etching chamber (connected pressure-fluidically to the examination chamber) in which, for example, electrode(s) and/or coil(s) are also disposed. Generally, the gas can be supplied, for example, by opening a valve, in particular a needle valve; "metered" means, for example, that an adjustment can also be made. The vacuum pump(s), for example, is or are operated further, and the intermediate pressure is set by correspondingly opening the valve.

In general, an etching rate of at least 0.05 nm/h is preferred for the etching of compounds containing oxygen and/or carbon, and a rate of at least 0.1 nm/h is more preferred and a rate of at least 0.15 nm/h is particularly preferred. Possible upper limits can be for example at most 600 nm/h, increasingly preferred in the sequence of at most 400 nm/h, 200 nm/h, 100 nm/h, 50 nm/h, 10 nm/h, 5 nm/h and 2.5 nm/h; one therefore then etches comparatively slowly.

As already stated above, during etching ideally no phase plate material is removed, but in the case of dry etching with argon as the process gas for example, a certain degree of removal can nevertheless take place. In relation to the phase plate material the etching rate should however be no more than for example 0.01 nm/h, 0.005 nm/h or 0.001 nm/h.

In general, the etching can last for example for at least 1 minute, preferably at least 10 minutes, more preferably at least 15 minutes, and at most (independently of these lower limits) at most 24 hours, preferably at most 6 hours, more preferably at most 3 hours.

Additional preferred configurations relate to the properties of the phase plate itself, and the disclosure should explicitly also be understood as relating to a TEM with a corresponding phase plate. Preferably, the phase plate has at least a first layer of a first phase plate material that is made of a metal, preferably comprising chrome, particularly preferably being made of chrome. The first layer can have a thickness of, for example, at least 3 nm, increasingly preferably in this sequence of at least 3.5 nm, 4 nm, 4.5 nm or 5 nm; upper limits independent of these lower limits are for example at most 20 nm, increasingly preferably in the sequence of at most 18 nm, 16 nm, 14 nm, 12 nm, 11 nm or 10 nm (the "thickness" is taken perpendicularly to the surface directions of the phase plate).

In a preferred configuration the phase plate has at least two layers (approximately 2, 3, 4 or 5 layers), one of the layers being made of silicon, preferably polysilicon. The thickness of this layer can be, for example, at least 3 nm, preferably at least 4 nm, more preferably at least 4.5 nm, and (independently of this lower limit) at most 30 nm, increasingly preferably in this sequence at most 25 nm, 20 nm, 15 nm, 10 nm, 7.5 nm or 6 nm.

Therefore, a phase plate with a first layer, in fact a chrome layer which is provided over a second layer, namely a polysilicon layer, is particularly preferred. The chrome layer can be applied, for example, by vapour coating or sputtering.

The invention also relates to a TEM that is designed for a method as described above and the phase plate is disposed in the beam path in the examination chamber of said TEM. Here the TEM further comprises a dry etching apparatus which is provided such that the phase plate can then be held in a holding atmosphere according to the definition given above. The dry etching apparatus, in particular electrodes for generating plasma, can also be provided in the examination chamber itself here, but is preferably disposed in a separate volume that is however connected pressure-fluidically to that of the examination chamber. In other words, the plasma is therefore not generated in the examination chamber itself, but radicals generated in the separate volume are supplied to the examination chamber.

The invention also relates to the use of this type of TEM wherein the phase plate is held in the holding atmosphere until irradiation, and reference is explicitly made once again to the features disclosed above within the context of the method and which should explicitly also be disclosed with regard to the use.

In the following the invention is described in more detail by means of an exemplary embodiment, no detailed distinction being made, furthermore, between the different categories of claim.

Figure 1:
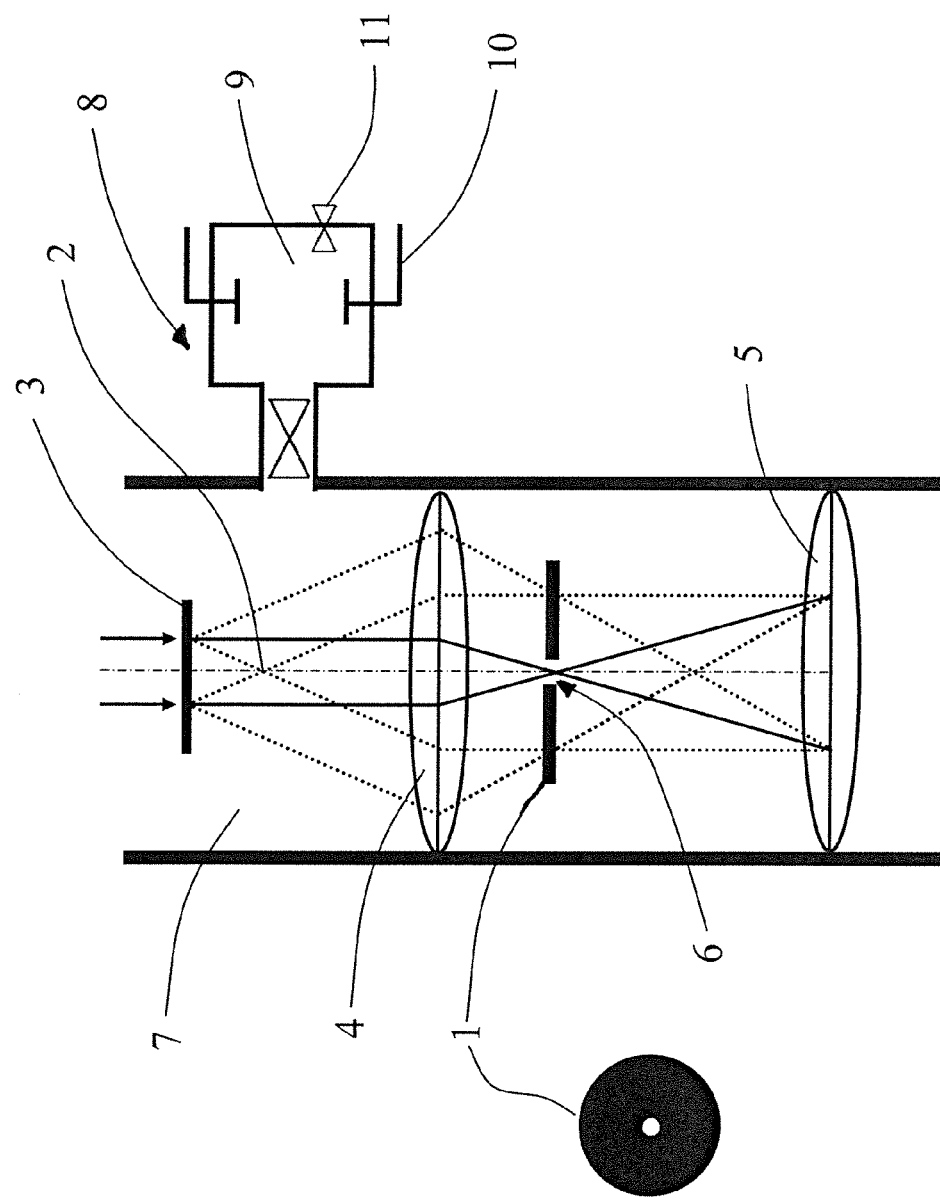
FIG. 1 shows a diagrammatic illustration of a TEM with a phase plate which is dry etched in the examination chamber.

As shown in FIG. 1, the phase plate 1 is disposed in the beam path 2 of the TEM, in fact downstream of the sample 3. Specifically, the phase plate 1 is provided between the objective lens 4 and the image lens 5. A through hole 6 with a diameter of approx. 0.5 μm is made centrally in the phase plate (diameters are generally between 0.2 and 1 μm), through which electrons not scattered by the sample 3 can pass without any further interaction. However, the electrons scattered by the sample 3 are subjected to a phase shift upon passing through the phase plate 1, and this leads to an image with greater contrast due to interference with the unscattered electrons.

A dry etching apparatus 8 is provided, pressure-fluidically connected to the examination chamber 7 of the TEM. In the plasma chamber 9 of said dry etching apparatus 8 a low pressure plasma is generated and corresponding electrodes 10 are arranged here (coils, for example, could also be provided as an alternative to electrodes). Oxygen is supplied here as the process gas, in fact oxygen from the ambient air (as an alternative, the gas from a specially attached pressure container could also be supplied). For this purpose a needle valve 11 at the plasma chamber 9 is opened and the inflow is set such that the pressure present in the sample chamber 7 and the plasma chamber 9 is approximately $5 \times 10^{-4}$ mbar.

The dry etching of the phase plate 1 takes place here before the first irradiation of the phase plate 1 with the electron beam, i.e. after the examination chamber 7 has been flooded and opened, the phase plate 1 has been inserted and evacuation to the intermediate pressure has taken place in the manner described above.

After the etching the needle valve 11 is closed and the examination chamber 7 is evacuated further until there is a final pressure of approx. $10^{-6}$ mbar. At this pressure the sample 3 can then be examined in the manner described above.

Figure 2:
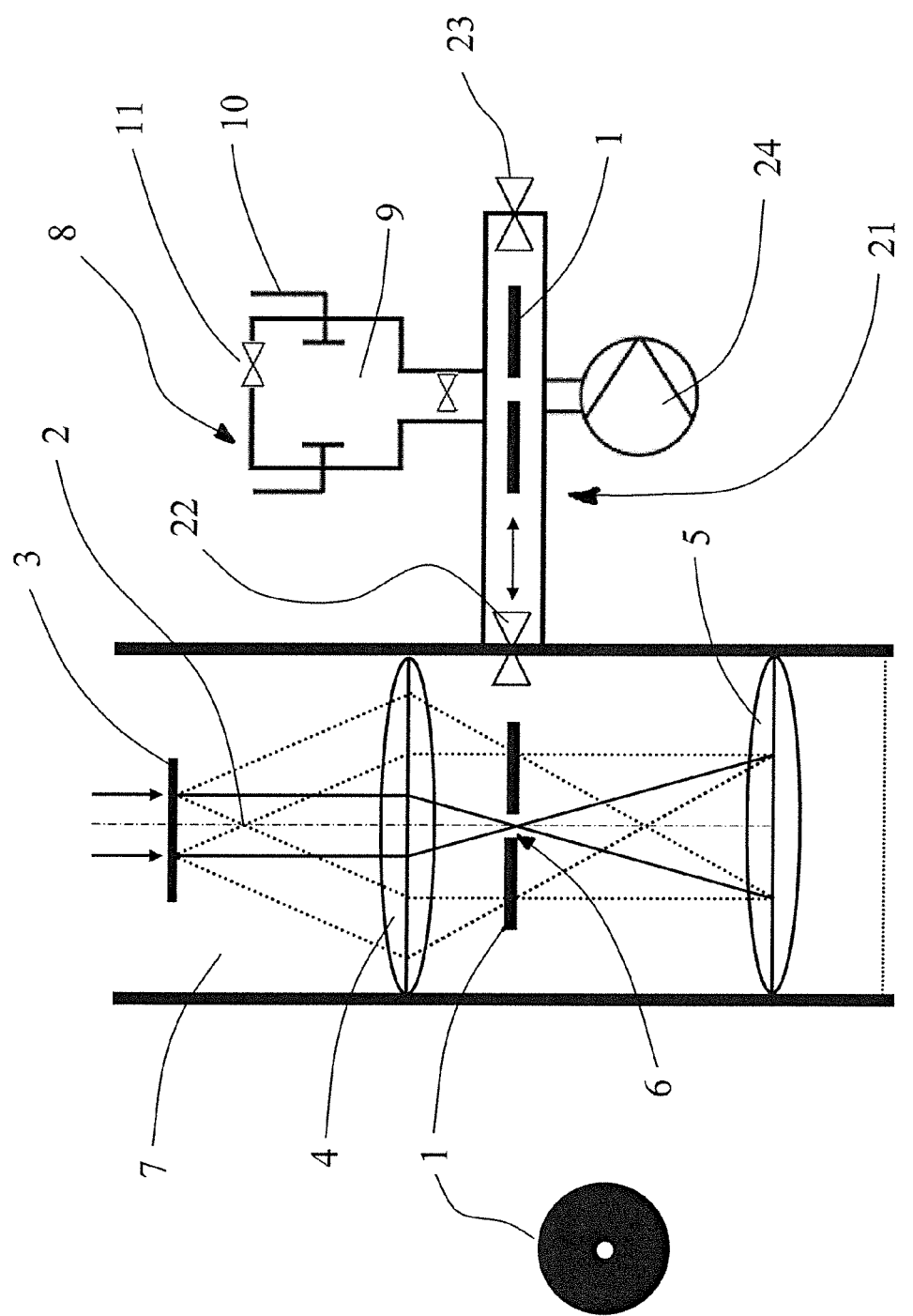
FIG. 2 shows diagrammatically a TEM with a phase plate which is dry etched in a sluice of the TEM.

FIG. 2 shows another embodiment which, as regards the structure of the TEM, corresponds to that of FIG. 1. In this case, however, a vacuum sluice 21 is additionally provided by means of which the phase plate 1 can be introduced into the examination chamber 7. For this purpose, when the inner sluicegate 22 is closed with respect to the examination chamber 7, the outer sluicegate 23 is opened in order to introduce the phase plate 1 (the pressure in the sluice chamber corresponds to the ambient air pressure here). After introducing the phase plate 1 and closing the outer sluicegate 23, the sluice 21 is evacuated up to an intermediate pressure of approx. $5 \times 10^{-4}$ mbar. In order to evacuate the sluice 21, a vacuum pump 24 is connected pressure-fluidically to the latter.

A dry etching apparatus 8 is provided, pressure-fluidically connected to the sluice 21, and a plasma is in turn generated between the electrodes 10. In order to supply oxygen as the process gas, there is in turn provided at the plasma chamber 9 of the dry etching apparatus 8 a needle valve 11 by means of which in this case oxygen is supplied from a pressure container (not shown). The supply is set here such that the intermediate pressure is approximately maintained.

After the etching of the phase plate 1 in the sluice chamber 21 the dry etching apparatus 8 is deactivated for a period of approx. one hour, i.e. the field applied to the electrodes 10 is switched off. Likewise, the supply of oxygen is stopped and the sluice 21 is evacuated further, in fact up to a final pressure of approx. $10^{-6}$ mbar.

Upon reaching this final pressure the inner sluicegate 22 is opened and the phase plate 1 is introduced into the (evacuated) examination chamber 7. Then the inner sluicegate 22 is closed again. The phase plate 1 is now available in the beam path of the TEM for the examination of a sample.

We claim:

1. A method for cleaning a phase plate which is designed to be disposed and irradiated in an examination chamber in the beam path of a transmission electron microscope (TEM), comprising:
    etching the phase plate with an etching agent that is suitable for removing a-compound that contains at least one of oxygen and carbon,
    said etching taking place before said phase plate is irradiated for the first time in said TEM, and
    after said etching, said phase plate being held for said irradiation in said TEM in a holding atmosphere in which the portion of at least one of compounds containing oxygen and compounds containing carbon is reduced, which for said compounds containing oxygen means a molecule concentration of at most $1 \cdot 10^{11}/cm^3$, and for said compounds containing carbon means a molecule concentration of at most $5 \cdot 10^{13}/cm^3$.

2. The method according to claim 1, wherein said holding atmosphere is a high vacuum.

3. The method according to claim 1, wherein said phase plate is etched and said etching is dry etching.

4. The method according to claim 3, wherein said dry etching takes place in said TEM.

5. The method according to claim 4, wherein said dry etching takes place in a sluice added to said examination chamber of said TEM, which sluice can be connected pressure-fluidically to said examination chamber by opening an inner sluicegate, said etching taking place when said inner sluicegate is closed.

6. The method according to claim 5, wherein when said inner sluicegate is closed, said phase plate is introduced into said sluice through an outer sluicegate, said outer sluicegate is then closed, and said sluice is evacuated to an intermediate pressure at which said dry etching then takes place, further evacuation then taking place up to a final pressure which is lower than said intermediate pressure by at least a factor of 10, and said inner sluicegate then being opened, and said phase plate being introduced into said examination chamber.

7. The method according to claim 4, wherein said dry etching takes place in said examination chamber of said TEM.

8. The method according to claim 7, wherein said examination chamber of said TEM is opened, when said examination chamber is flooded said phase plate is inserted, and said examination chamber is then evacuated up to an intermediate pressure at which said dry etching then takes place, evacuation then taking place to a final pressure which is lower than said intermediate pressure by at least a factor of 10.

9. The method according to claim 3, wherein a process gas provided for said dry etching comprises at least one of hydrogen and oxygen.

10. The method according to claim 4, wherein a gas containing oxygen, is supplied to the region where dry etching will take place, in order to set an intermediate pressure of at most $5 \cdot 10^{-3}$ mbar and at least $5 \cdot 10^{-5}$ mbar and to dry etch with oxygen as the process gas.

11. The method of claim 1, wherein said phase plate is etched and said etching agent has an etching rate of at least 0.05 nm/h in relation to said compound containing at least one of oxygen and carbon.

12. The method according to claim 1, wherein said phase plate has at least a first layer of a first phase plate material that is made of a metal.

13. The method according to claim 1, wherein said phase plate has at least a first layer of a first phase plate material and a second layer of a second phase plate material, which second phase plate material is made of silicon.

* * * * *